United States Patent [19]

Weishaupt et al.

[11] Patent Number: 4,493,102
[45] Date of Patent: Jan. 8, 1985

[54] PROCESS AND APPARATUS FOR ALTERNATELY SWITCHING RADIO SIGNALS OVER RESPECTIVE AUDIO CHANNELS

[75] Inventors: Walter Weishaupt; Wilfried Steins, both of Munich, Fed. Rep. of Germany

[73] Assignee: Bayerische Motoren Werke Aktiengesellschaft, Fed. Rep. of Germany

[21] Appl. No.: 482,002

[22] Filed: Apr. 5, 1983

[30] Foreign Application Priority Data

Apr. 5, 1982 [DE] Fed. Rep. of Germany ....... 3212615

[51] Int. Cl.³ .............................................. H04B 7/08
[52] U.S. Cl. ......................................... 381/2; 381/94; 455/134; 455/303
[58] Field of Search ............... 455/302, 303, 166, 225, 455/52, 59, 132–136; 381/2, 3, 13, 94

[56] References Cited

U.S. PATENT DOCUMENTS

| 4,008,439 | 2/1977 | Schroeder | 455/303 X |
| 4,246,655 | 1/1981 | Parker | 455/303 X |
| 4,259,742 | 3/1981 | Burns et al. | 455/134 X |

FOREIGN PATENT DOCUMENTS 1411704 10/1975 United Kingdom ................ 455/134

*Primary Examiner*—R. J. Hickey
*Attorney, Agent, or Firm*—Craig & Burns

[57] ABSTRACT

System for routing stereo radio frequency signals over alternate audio channels in response to detection of an interference in one of the stereo signals. The system delays the radio signals during which time it detects whether an interference has corrupted one of the radio signals. If a corruption has occured, the system switches the non-corrupted signal to an active one of the audio channels so that the interference is prevented from being reproduced prior to reaching an audio output.

10 Claims, 2 Drawing Figures

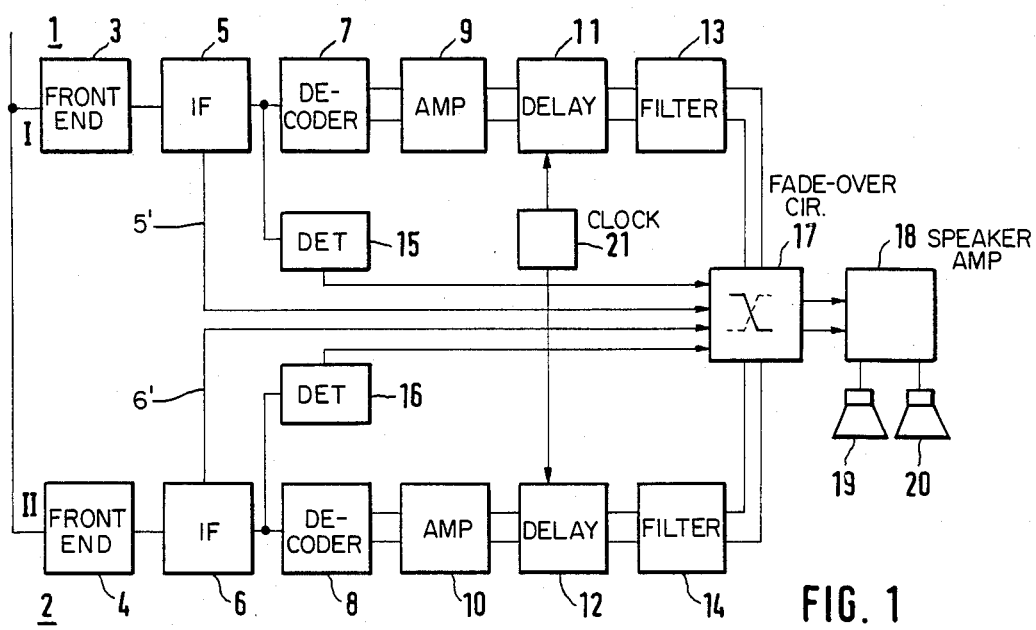
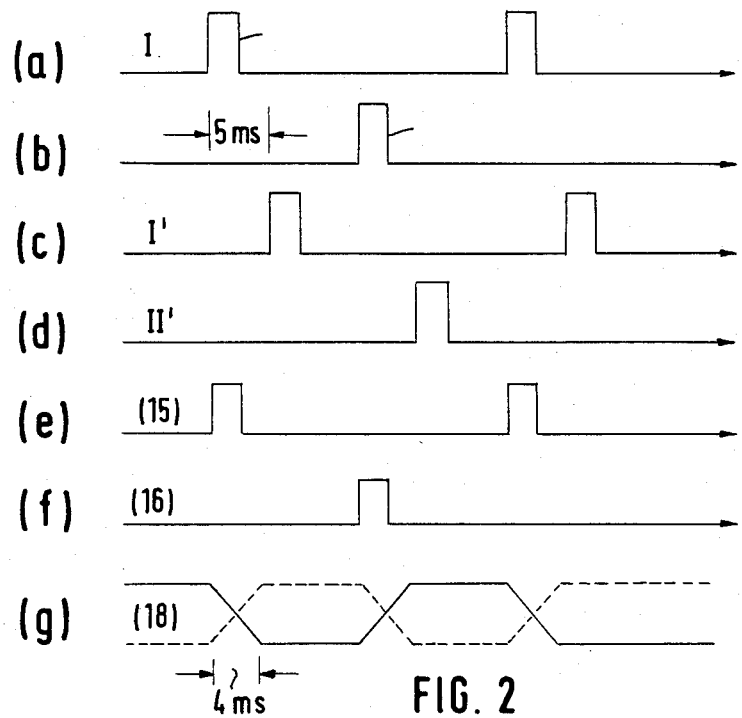

PROCESS AND APPARATUS FOR ALTERNATELY SWITCHING RADIO SIGNALS OVER RESPECTIVE AUDIO CHANNELS

BACKGROUND OF THE INVENTION

This invention relates to a process apparatus for switching over the reproduction of a radio signal to another radio signal of the same modulation content to substantially avoid reproduction of interference.

The invention concerns the effects of a time shift of two radio signals of identical modulation content, caused, for example, by differing positions, at the reception site. If, in case of an interference in the reproduced radio signal, switchover is carried out to the transmitter of the other radio signal without transition, then the time delay of the two radio signals results in considerable impairment of reproduction quality during switchover. Thus, the switchover is audible, for example, in the form of a clicking noise. Causes for this are, for example, antiphase positions of frequency components of the two radio signals.

SUMMARY OF THE INVENTION

The object of this invention is the improvement in the reproduction quality when switching over from one radio signal to another.

The invention improves reproduction quality by providing that, upon interference in the reproduced radio signal, the latter signal is gradually faded-out in reproduction intensity, and the other radio signal is faded-in to the same extent.

By the gradual fade-over from an intially reproduced transmitter to another transmitter, it is possible to extensively eliminate factors impairing reproducing quality. With the fading-out of the initially reproduced transmitter, the reproduction of interference is quickly diminished in intensity and replaced by the interference-free other radio signal.

In order to further eliminate disturbance in reproduction, an additional measure can be taken. This measure resides in that the reproduction of the radio signals is delayed with respect to their reception by a predetermined time period. Upon interference, the fade-over process is initiated. The interference, due to the delay time, is not as yet reproduced once it reaches the receiver. However, upon the elapse of this time period, the fade-over process to the other transmitter has at least already been initiated.

The reproduction of interference can be entirely prevented if the fade-over process has been concluded when the delay period ends. For this purpose, the delay period is at least equal to the duration of the fade-over process. The delay time can be chosen to be somewhat longer than the duration of the fade-over procedure, thereby to prevent reproduction of any interference, the intensity of which increases relatively slowly when it begins.

It is to be pointed out that the delayed reproduction of radio signals with respect to their reception in a defined fashion is one important feature of this invention, while another feature involves the gradual fade-over process. The occurrence of an interference in reproduction can be avoided by time delay, independently of the type of modulation comparison and transmitter switchover process. If a disturbance of the reproduced radio signal is transmitted to the receiver, the time delay makes it possible to switch over to the reproduction of the other, undisturbed radio signal even before this disturbance is reproduced. The disclosed further development of the invention in the form of the time delay between reception and reproduction of the radio signals accordingly is another feature of the invention.

An especially advantageous circuit arrangement for effecting the last-described, delayed reproduction of the radio signals consists of conventional bucket brigade circuits transmitting the modulation signals of the two transmitters, of an interference identifying circuit connected in front thereof, and of a fade-over device from one transmitter to the other, connected thereafter. In this connection, conventional interference identifying circuits can be employed, for example, as they are known under the designation of ASU (analogue stimulus unit) or EIC (electromagnetic interference control).

These and other objects, features and advantages of the present invention will become more apparent from the following description when taken in connection with the accompanying drawings which show, for purposes of illustration only, one embodiment in accordance with the present invention.

BRIEF DESCRIPTION OF THE DRAWINGS

FIG. 1 shows the construction, in principle, of a circuit arrangement for a process for interference-free reproduction of a radio signal and;

FIG. 2 is a diagram for explaining the mode of operation of the process.

DESCRIPTION OF THE INVENTION

A circuit arrangement utilized, for example, in an automobile car radio, includes two parallel reception and reproduction branches 1 and 2, respectively, for two radio signals having the same modulation content. This sameness is determined, for example, in the way described in German Pat. No. 3,037,411.

Each one of the branches 1 and 2 includes a receiving section (front end) 3 and 4, respectively, an IF (intermediate-frequency) section 5 and 6, respectively, a conventional stereo decoder 7 and 8, respectively, an amplifier section 9 and 10, respectively, bucket brigade (delay) circuits 11 and 12, respectively, as well as conventional filters 13 and 14, respectively.

One interference identifying (detector) circuit 15 and 16 of each of the respective branches is connected between IF sections 5 and 6 and the subsequently arranged stereo decoders 7 and 8. The output of such interference identifying circuit as well as additional outputs 5' and 6' of the IF sections 5 and 6 and of the filters 13 and 14 are connected to a conventional AF (audio-frequency) fade-over unit 17. This unit yields, for each stereo channel operating in respective different frequency modes, an input signal for final stage (speaker amplifier) 18, to which reproduction speakers 19 and 20, respectively, are connected.

The bucket brigade circuits 11 and 12 are timed synchronously by a conventional clock generator 21. They exhibit identical structure and include a plurality of identical analog storage elements, for example, in the form of conventional field-effect transistors, respectively. They effect a delay of the radio signals passing to the final stage 18 with respect to their arrival at the inputs of receivers 3 and 4. The delay period attained is established so that upon the occurrence of an interference of the instantaneously reproduced radio signal, the switch-over to the reproduction of the other radio signal, conducted with the aid of the fade-over unit 17, takes place before this interference would pass to speakers 19 and 20.

If a disturbance occurs in the radio signal and/or in the field strength of the transmitter, the interference identifying circuit 15 or 16 of IF sections 5 and 6 (via 5' and 6') of the branch 1 or 2, respectively, connected to the final stages actuates the fade-over unit 17 and causes the latter to gradually fade out this branch while fading in the other branch instead. This fade-over is concluded before the interference has passed through the respective bucket brigade circuit 11 and 12, respectively. By the gradual fade-over with the aid of the fade-over unit 17, switchover to the other branch is accomplished without impairment in sound reproducing quality because, for example, anti-phase positions cannot have an audible effect.

The diagram of FIG. 2 shows and explains the interference suppression attained by the time delay of the radio signals.

FIG. 2(a) shows two time-displaced interference pulses in the AF signal of the transmitter I reproduced with the aid of branch 1. FIG. 2(b) shows an interference pulse in the corresponding radio signal of a transmitter II, processed in branch 2. FIGS. 2(c) and 2(d) show the signals from the two transmitters I' and II' present at the output of the bucket brigade circuits 11 and 12. FIGS. 2(e) and 2(f) show the output signals transmitted by the interference identifying circuits 15 and 16, respectively, to the fade-over unit 17. Finally, FIG. 2(g) shows the reproduction intensity of the radio signals from the two transmitters I and II. In this illustration, the intensity of transmitter I is shown in solid lines and that of transmitter II in broken lines.

The input signal from transmitter I is to be reproduced first. In this case, the branch 1 is connected and controls the final stage 18 while the input signal from transmitter II does not pass to the reproduction speakers. For this purpose, the output signal of branch 2 is blocked by the fade-over unit 17. If then the interference occurs illustrated in FIG. 2(a), the fade-over unit 17 is activated by the interference identifying circuit 15 with the consequence that at this point in time fade-over is effected to the reproduction of the radio signal in channel II. In this procedure, the branch 2 is gradually activated to pass signals to the final stage 18, and the signals of branch 1 are correspondingly blocked. After a predetermined time period of, for example, 4 milliseconds, the transmitter II is the only one passing signals. Due to the delay of the reproduction of the AF signal from transmitter I and thus also of the occurring interference [FIG. 2(c)], effected with the aid of the bucket brigade circuit 11, fading over to transmitter II has already been concluded at the time the interference is applied to the output of the bucket brigade circuit 11. It is merely necessary for this purpose to conduct fade-over within the delay effected by the bucket brigade circuits. The delay period is chosen to be, for example, equal to 5 milliseconds.

Upon occurrence of the interference in transmitter II [FIG. 2(b) of the diagram], reversed fade-over to transmitter I is carried out. Instead of branch 2, the transmitter I is now again operatively connected to the final stage 18. The interference due to transmitter II cannot become effective, either, on account of the action of the bucket brigade circuit 12, since before such interference passes to the output of the bucket brigade circuit 12 and thus to the input of the fade-over unit 17, the branch 2 has been blocked.

Finally, a renewed interference in channel I leads to fade-over to the reproduction of the radio signal from channel II even before this interference could be reproduced.

While we have shown and described one embodiment in accordance with the present invention, it is understood that the same is not limited thereto but is susceptible of numerous changes and modifications as known to those skilled in the art, and we, therefore, do not wish to be limited to the details shown and described herein, but intend to cover all such changes and modifications as are encompassed by the scope of the appended claims.

We claim:

1. A process for switching over to alternate reproducing channels the reproduction of a first radio signal and a second radio signal of the same modulation content but of a different frequency mode, comprising the steps of, delaying the reproduction of the radio signals with respect to their reception by a first predetermined time period, detecting the occurrence of an interference in a corrupted one of said first and second radio signals, and decreasing the intensity of the corrupted one of said radio signal while increasing the intensity of the other interference-free radio signal to the same modulation during a second predetermined time period.

2. The process according to claim 1, wherein the the second predetermined time period is equal to or greater than the first predetermined time period.

3. A circuit arrangement for switching first and second radio signals over alternate reproducing channels, comprising two parallel bucket brigade circuit means for passing the modulation signals of two transmitters which generate said first and second radio signals; two parallel interference identifying circuit means for interrupting interference in one of the modulation signals before the respective radio signal passes through the bucket brigade circuit means; a fade-over circuit for decreasing one radio signal containing interference and increasing the other radio signal; said fade-over circuit means connected to and after the bucket brigade circuit means and the interference identifying circuit means; and reproduction means connected to the fade-over circuit means for reproducing one of said signals applied thereto.

4. The circuit arrangement of claim 3, wherein a clock generator means interconnects the two parallel bucket brigade circuit means for timing said circuit means sychronously.

5. The circuit arrangement of claim 3, wherein a stereo decoder is connected before one of the transmitters and one of the bucket brigade circuit means.

6. The circuit arrangement of claim 5, wherein an amplifier is connected between the stereo decoder and said one bucket brigade circuit means.

7. The circuit arrangement of claim 3, wherein a filter is connected between one of the bucket brigade circuit means and the fade-over circuit means.

8. The circuit arrangement of claim 3, wherein the bucket brigade circuit means includes analogue storage elements.

9. The circuit arrangement of claim 8, wherein the analogue storage elements include field-effect transistors.

10. A process for switching over to alternate reproducing channels the reproduction of a first radio signal and a second radio signal of the same modulation content but of a different frequency mode, comprising the steps of delaying said first and second signals for a first predetermined time period, detecting the occurrence of an interference in a corrupted one of said first and second radio signals, and decreasing the intensity of the corrupted one of said radio signal while increasing in the intensity of the other interference-free radio signal to the same modulation during a second predetermined time period.

* * * * *